(12) United States Patent
Kadoi et al.

(10) Patent No.: US 12,132,411 B2
(45) Date of Patent: Oct. 29, 2024

(54) POWER SUPPLY MODULE AND CHARGED PARTICLE BEAM DEVICE

(71) Applicant: Hitachi High-Tech Corporation, Tokyo (JP)

(72) Inventors: Ryo Kadoi, Tokyo (JP); Wen Li, Tokyo (JP); Naoya Ishigaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 455 days.

(21) Appl. No.: 17/763,840

(22) PCT Filed: Oct. 7, 2019

(86) PCT No.: PCT/JP2019/039497
§ 371 (c)(1),
(2) Date: Mar. 25, 2022

(87) PCT Pub. No.: WO2021/070223
PCT Pub. Date: Apr. 15, 2021

(65) Prior Publication Data
US 2022/0319795 A1    Oct. 6, 2022

(51) Int. Cl.
*H02M 7/10*    (2006.01)
*H01J 19/02*    (2006.01)
(Continued)

(52) U.S. Cl.
CPC ............. *H02M 7/103* (2013.01); *H01J 19/02* (2013.01); *H01J 37/241* (2013.01); *H02M 1/14* (2013.01);
(Continued)

(58) Field of Classification Search
CPC ........ H02M 7/103; H02M 7/062; H02M 7/10; H02M 1/14; H01J 37/241
See application file for complete search history.

(56) References Cited

U.S. PATENT DOCUMENTS 6,154,382 A * 11/2000 Kawahara ............. H02M 7/103
363/68
2002/0067631 A1 * 6/2002 Lunding .................. H05G 1/10
363/131
(Continued)

FOREIGN PATENT DOCUMENTS

JP    11-225476 A    8/1999
JP    2000-116132 A    4/2000
(Continued)

OTHER PUBLICATIONS

International Search Report (PCT/ISA/210) issued in PCT Application No. PCT/JP2019/039497 dated Dec. 10, 2019 with English translation (five (5) pages).
(Continued)

*Primary Examiner* — Alexander H Taningco
*Assistant Examiner* — Pedro C Fernandez
(74) *Attorney, Agent, or Firm* — Crowell & Moring LLP (57) ABSTRACT

The invention provides a power supply module and a charged particle beam device that are capable of reducing ripple noise. A high-voltage generation circuit 101 includes booster circuits CPa and CPb of two systems that are configured to be symmetrical to each other, and performs a boosting operation by using a capacitive element and a diode in the booster circuits CPa and CPb of the two systems. The high-voltage generation circuit is housed in a housing and a reference power supply voltage is applied thereto. A left electrode 102a is fixedly provided in the vicinity of one of the booster circuits CPa and CPb of the two systems in the housing, and a right electrode 102b is fixedly provided in the vicinity of the other of the booster circuits CPa and CPb of the two systems in the housing. A stray capacitance adjustment circuit 100a adjusts capacitance values of stray capacitances of the booster circuits CPa and CPb of the two systems by electrically controlling an electrical connection (Continued)

characteristic between the left electrode 102a and the reference power supply voltage 104 and an electrical connection characteristic between the right electrode 102b and the reference power supply voltage 104.

10 Claims, 10 Drawing Sheets

(51) Int. Cl.
    *H01J 37/24*     (2006.01)
    *H02M 1/14*     (2006.01)
    *H02M 7/06*     (2006.01)
    *H05H 5/04*     (2006.01)

(52) U.S. Cl.
    CPC ............. *H02M 7/062* (2013.01); *H02M 7/10* (2013.01); *H05H 5/045* (2013.01); *H01J 2203/02* (2013.01)

(56) References Cited

U.S. PATENT DOCUMENTS

| | | | | |
|---|---|---|---|---|
| 2003/0058659 | A1* | 3/2003 | Klinkowstein | ..... H02M 3/3376 |
| | | | | 363/125 |
| 2020/0221566 | A1* | 7/2020 | Kadoi | ...................... H05H 5/04 |

FOREIGN PATENT DOCUMENTS

| | | |
|---|---|---|
| JP | 2002-175900 A | 6/2002 |
| JP | 2017-131022 A | 7/2017 |
| WO | WO 2019/016857 A1 | 1/2019 |

OTHER PUBLICATIONS

Japanese-language Written Opinion (PCT/ISA/237) issued in PCT Application No. PCT/JP2019/039497 dated Dec. 10, 2019 (three (3) pages).

\* cited by examiner

| COMBINATION No. | SWITCH No. | | | | | |
|---|---|---|---|---|---|---|
| | 1 | 2 | 3 | 4 | 5 | 6 |
| 1 | ON | ON | ON | ON | ON | ON |
| 2 | ON | ON | ON | ON | ON | OFF |
| 3 | ON | ON | ON | ON | OFF | ON |
| 4 | ON | ON | ON | ON | OFF | OFF |
| ⋮ | ⋮ | | | | | |
| 64 | OFF | OFF | OFF | OFF | OFF | OFF |

POWER SUPPLY MODULE AND CHARGED PARTICLE BEAM DEVICE

TECHNICAL FIELD

The present invention relates to a power supply module and a charged particle beam device, for example, a power supply module including a symmetric Cockcroft-Walton circuit, and a charged particle beam device operated by a power supply from the power supply module.

BACKGROUND ART

PTL 1 discloses a DC high-voltage power supply device including: two ground plates each of which is disposed so as to face one of end faces on both outer sides of a secondary coil of a booster coil in a pressure tank with a gap between the ground plate and the end face; and two distance adjusting mechanisms that adjust distances between the two ground plates and the end faces of the secondary coil facing the ground plates, respectively.

CITATION LIST

Patent Literature

PTL 1: JP-A-H11-225476

SUMMARY OF INVENTION

Technical Problem

A power supply module that supplies a high-voltage power supply includes, for example, a high-voltage generation circuit such as a symmetric Cockcroft-Walton circuit. In such a high-voltage generation circuit, a circuit configuration is made line-symmetric, so that it is possible to cancel ripple noise generated on both sides of a line symmetry axis. On the other hand, in the power supply module, a stray capacitance (weak electrical coupling) is formed between the high-voltage generation circuit and a housing to which a reference power supply voltage is applied, and between capacitive elements provided in the high-voltage generation circuit. A capacitance value of the stray capacitance is determined by a mounting position, a mounting direction, and the like of each component.

Therefore, for example, if the mounting position or the mounting direction varies at the time of mounting the component, the capacitance value of the stray capacitance also varies accordingly. As a result, symmetry of the circuit configuration may decrease and the ripple noise may increase. In particular, in a power supply module having a molded configuration in which a high-voltage generation circuit is covered with an insulating resin member inside a housing, since a relative dielectric constant of the insulating resin member is larger than that of air, the capacitance value of the stray capacitance is increased. In this case, the symmetry of the circuit configuration is more likely to decrease, and the ripple noise is more likely to increase. On the other hand, PTL 1 discloses a method of mechanically variably adjusting the capacitance value of the stray capacitance. However, the method is difficult to apply to the power supply module having the molded configuration described above.

The invention is made in view of the above circumstances, and an object thereof is to provide a power supply module and a charged particle beam device that are capable of reducing ripple noise.

The above-mentioned object as well as other objects and novel features of the invention will become clear based on descriptions of the present Description and accompanying drawings.

Solution to Problem

An outline of a representative one of the embodiments disclosed in the present application will be briefly described as follows.

A power supply module according to a representative embodiment of the invention includes a symmetric high-voltage generation circuit, a housing, first and second electrodes, and a stray capacitance adjustment circuit. The high-voltage generation circuit includes booster circuits of two systems that are configured to be symmetrical to each other, and performs a boosting operation by using a capacitive element and a diode in the booster circuits of the two systems. The housing houses the high-voltage generation circuit and a reference power supply voltage is applied thereto. The first electrode is fixedly provided in a vicinity of one of the booster circuits of the two systems in the housing, and the second electrode is fixedly provided in a vicinity of the other of the booster circuits of the two systems in the housing. The stray capacitance adjustment circuit adjusts a capacitance value of a stray capacitance of the booster circuits of the two systems by electrically controlling an electrical connection characteristic between the first electrode and the reference power supply voltage and an electrical connection characteristic between the second electrode and the reference power supply voltage.

Advantageous Effect

Effects obtained by representative embodiments of the inventions disclosed in the present application can be briefly described as being able to reduce ripple noise in the power supply module.

DESCRIPTION OF EMBODIMENTS

In the following embodiments, when a number and the like (including the number, a numeric value, an amount, a range, and the like) of an element are referred to, the number and the like are not limited to a specific number, and may be equal to or greater than the specific number or equal to or less than the specific number, unless otherwise particularly specified or unless the number and the like are clearly limited to the specific number in principle. In the following embodiments, it is needless to say that constituent elements (including element steps and the like) are not necessarily essential unless otherwise particularly specified or unless clearly considered as essential in principle. Similarly, in the following embodiments, shapes, positional relationships, and the like of constituent elements and the like include those substantially approximate or similar to the shapes and the like unless otherwise particularly specified or unless considered to be obviously not the case in principle. The same applies to the numerical value and the range.

Hereinafter, embodiments of the invention will be described in detail with reference to the drawings. In all the drawings for illustrating the embodiments, the same components are denoted by the same reference signs in principle, and a repeated description thereof is omitted.

First Embodiment

<<Configuration of Power Supply Module>>

Figure 1:
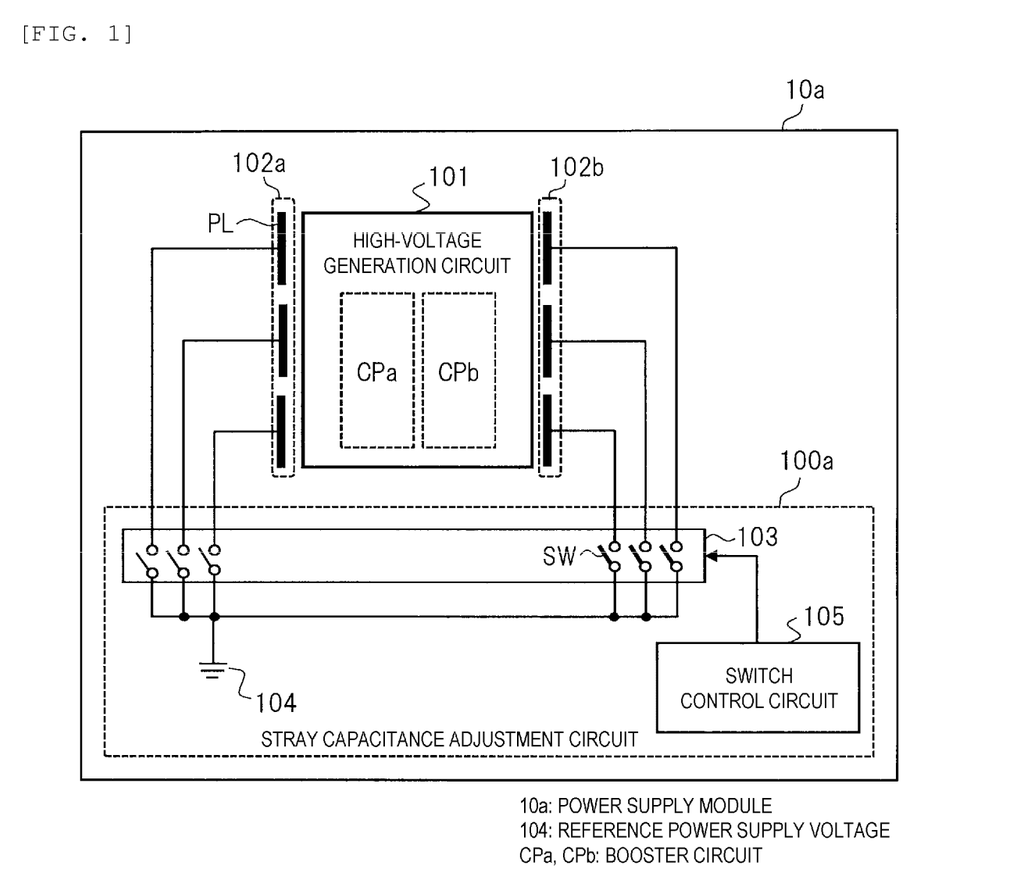
FIG. 1 is a schematic diagram showing a configuration example of a power supply module according to a first embodiment of the invention.
Figure 2:
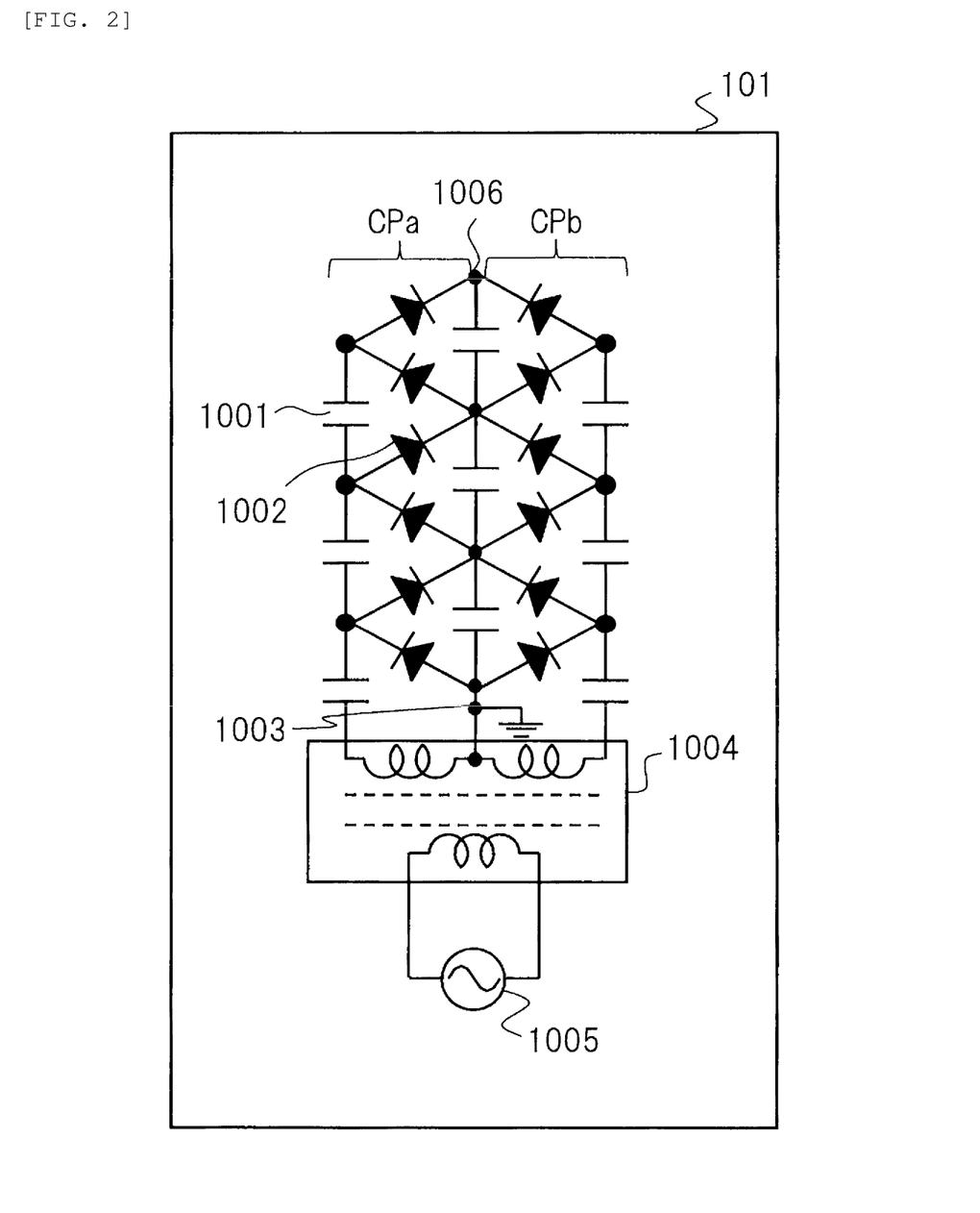
FIG. 2 is a circuit diagram showing a configuration example of a high-voltage generation circuit in FIG. 1.

FIG. 1 is a schematic diagram showing a configuration example of a power supply module according to a first embodiment of the invention. FIG. 2 is a circuit diagram showing a configuration example of a high-voltage generation circuit in FIG. 1. A power supply module (in other words, a high-voltage power supply device) 10a shown in FIG. 1 includes a high-voltage generation circuit 101, a left electrode (a first electrode) 102a, a right electrode (a second electrode) 102b, and a stray capacitance adjustment circuit 100a.

The high-voltage generation circuit 101 is typically a symmetric Cockcroft-Walton circuit or the like, as shown in FIG. 2. The high-voltage generation circuit 101 in FIG. 2 includes a reference node 1003, an output node 1006, booster circuits CPa and CPb of two systems, a transformer 1004, and an AC signal source 1005. A reference power supply voltage (for example, a ground power supply voltage) is applied to the reference node 1003, and an output voltage is generated at the output node 1006.

The booster circuits CPa and CPb of the two systems include a plurality of capacitive elements 1001 and a plurality of diodes 1002 connected in a ladder shape between the reference node 1003 and the output node 1006. The booster circuits CPa and CPb of the two systems have a symmetrical configuration with respect to a line symmetric axis that connects the reference node 1003 and the output node 1006.

The AC signal source 1005 supplies an AC voltage to the transformer 1004. The transformer 1004 receives the AC voltage and applies input voltages having opposite phases to the booster circuits CPa and CPb of the two systems. The high-voltage generation circuit 101 sequentially boosts (adds) and rectifies the input voltages by using the capacitive elements 1001 and the diodes 1002 in the booster circuits CPa and CPb of the two systems. As a result, a high voltage (for example, several kV to several tens of kV) obtained by boosting, adding, and rectifying the input voltages is generated at the output node 1006.

In FIG. 1, the left electrode 102a is fixedly provided in the vicinity of one (here, CPa) of the booster circuits CPa and CPb of the two systems. The right electrode 102b is fixedly provided in the vicinity of the other (here, CPb) of the booster circuits CPa and CPb of the two systems. Each of the left electrode 102a and the right electrode 102b is configured with a single or a plurality (here, a plurality) of split electrodes PL. The split electrodes PL are, for example, conductor plates.

The stray capacitance adjustment circuit 100a includes a switch group 103 including a plurality of switches SW and a switch control circuit 105. The plurality of switches SW are configured with, for example, power transistors or relays, and are connected between the plurality of split electrodes PL in the left electrode 102a and the right electrode 102b and a reference power supply voltage 104, respectively. The switch control circuit 105 is configured with, for example, a driver circuit that drives the power transistors or the relays, and controls on and off of each of the plurality of switches SW.

With such a configuration, the stray capacitance adjustment circuit 100a electrically controls electrical connection characteristics between the left electrode 102a and the reference power supply voltage 104 and electrical connection characteristics between the right electrode 102b and the reference power supply voltage 104. Thus, the stray capacitance adjustment circuit 100a adjusts capacitance values of stray capacitances of the booster circuits CPa and CPb of the two systems.

<<Implementation of Power Supply Module>>

Figure 3:
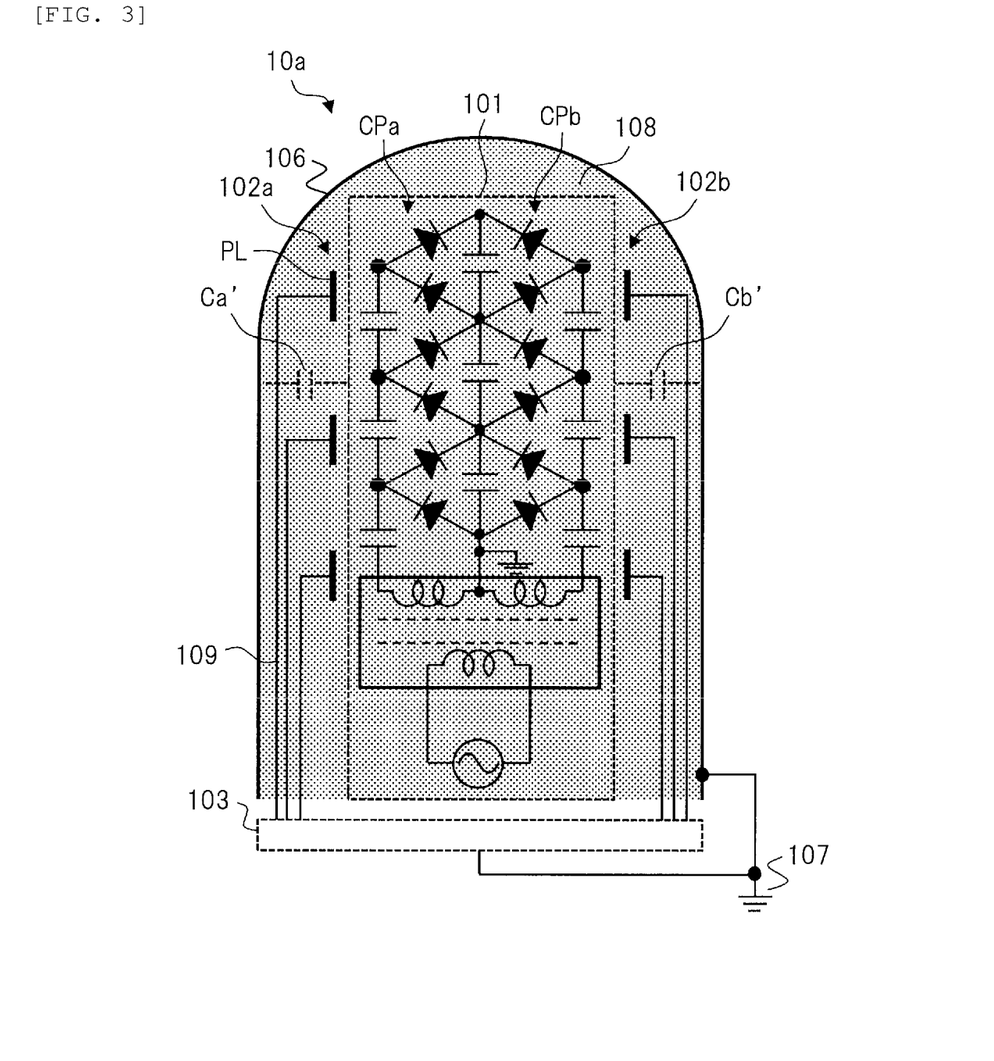
FIG. 3 is a schematic diagram showing an example of an implementation of a main part of the power supply module in FIG. 1.

FIG. 3 is a schematic diagram showing an example of an implementation of a main part of the power supply module in FIG. 1. The power supply module 10a in FIG. 3 includes a conductive housing (case) 106 that houses the high-voltage generation circuit 101, the left electrode 102a, and the right electrode 102b shown in FIG. 1, and an insulating resin member 108. A reference power supply voltage (for example, a ground power supply voltage) 107 is applied to the housing 106. The insulating resin member 108 is provided in the housing 106 so as to cover (in other words, mold) the high-voltage generation circuit 101, the left electrode 102a, and the right electrode 102b.

The high-voltage generation circuit 101 is configured with, for example, a wiring circuit board on which the capacitive elements 1001 and the diodes 1002 in FIG. 2 and the like are mounted. The left electrode 102a is provided in the vicinity of the booster circuit CPa mounted on the wiring circuit board. Specific installation modes thereof include, for example, a mode of being installed at a place different from the wiring circuit board, and a mode of being attached on the wiring circuit board in the vicinity of the booster circuit CPa (for example, at an outer peripheral portion of the wiring circuit board). The same applies to the right electrode 102b.

The left electrode 102a and the right electrode 102b are connected to the switch group 103 via adjustment wiring 109, and are connected to the same reference power supply voltage 107 as the housing 106 via the switch group 103. However, in some cases, a connection destination of the switch group 103 may be a reference power supply voltage different from that of the housing 106.

The switch group 103 may be mounted on the same wiring circuit board as the high-voltage generation circuit 101 together with the switch control circuit 105 (for example, a driver circuit) in FIG. 1, or may be configured as a component separate from the wiring circuit board. The adjustment wiring 109 is wiring on the wiring circuit board, cable wiring separate from the wiring circuit board, or the like. At least a part of the adjustment wiring 109 is covered with the insulating resin member 108 regardless of an implementation.

Here, the high-voltage generation circuit 101 is usually housed in the housing 106 to which the reference power supply voltage 107 is applied, as shown in FIG. 3. Accordingly, it is possible to shield a discharge from the high-voltage generation circuit 101 to an outside and the like, and to insulate the high-voltage generation circuit 101 from the outside. Furthermore, in order to perform the insulation at a shorter distance (to reduce a size of the power supply module 10a), it is desirable to provide the insulating resin member 108 having higher insulating performance than air between the high-voltage generation circuit 101 and the housing 106. However, in general, the insulating resin member 108 has a higher dielectric constant than the air.

When such a configuration is used, stray capacitances Ca' and Cb' are formed between the high-voltage generation circuit 101 and the housing 106. The stray capacitance Ca' is formed between the one booster circuit CPa in the high-voltage generation circuit 101 and the housing 106, and the stray capacitance Cb' is formed between the other booster circuit CPb in the high-voltage generation circuit 101 and the housing 106. Capacitance values of the stray capacitances Ca' and Cb' are increased when the insulating resin member 108 is provided.

Here, when the capacitance value of the stray capacitance Ca' and the capacitance value of the stray capacitance Cb' are the same, symmetry of the high-voltage generation circuit 101 can be maintained. However, for example, when a shift occurs in a positional relationship between the high-voltage generation circuit 101 (for example, the wiring circuit board) and the housing 106 at the time of assembly (at the time of mounting components), or when a shift occurs in mounting positions of the components (especially the capacitive elements 1001) on the wiring circuit board, the capacitance values of the stray capacitances Ca' and Cb' are unbalanced. A degree of the imbalance is increased especially when the insulating resin member 108 is provided and is further increased when an insulating distance is shortened accordingly. Further, as the degree of the imbalance increases, it is difficult to maintain the symmetry of the high-voltage generation circuit 101, and ripple noise may increase.

<<Operation of Stray Capacitance Adjustment Circuit>>

Therefore, it is useful to adjust the capacitance values of the stray capacitances of the booster circuits CPa and CPb by using the stray capacitance adjustment circuit 100a in FIG. 1. Specifically, for example, when a part of the split electrodes PL in the left electrode 102a are connected to the reference power supply voltage 107 (or 104) via the switches SW in an ON state, the capacitance value of the stray capacitance of the booster circuit CPa increases. On the other hand, when the split electrodes PL in the left electrode 102a are in a floating state by the switches SW in an off state, the capacitance value of the stray capacitance of the booster circuit CPa does not change.

Thus, the switch control circuit 105 controls the on and off states of the plurality of switches SW so that control of increasing/not increasing the stray capacitance for each of the booster circuits CPa and CPb can be performed. Accordingly, it is possible to perform adjustment so that the capacitance values of the stray capacitances of the booster circuits CPa and CPb are in a balanced state. As a specific example, when the capacitance values of the stray capacitances Ca' and Cb' originally formed in the booster circuits CPa and CPb of the two systems are "Ca'<Cb'", the stray capacitance on the booster circuit CPa side may be increased by using the left electrode 102a.

Such an adjustment of the capacitance values of the stray capacitances is executed after the assembly of the power supply module 10a, including the insulating resin member 108, is completed. As a result, in the power supply module 10a after assembly, the symmetry of the high-voltage generation circuit 101 can be maintained, and the ripple noise can be reduced.

More specifically, the switch control circuit 105 receives, for example, an instruction of an on and off state from the outside via predetermined signal wiring, and controls the on and off states of the plurality of switches SW based on the instruction. In this case, it is sufficient that a signal can be transmitted to the predetermined signal wiring after the power supply module 10a is assembled.

Main Effects of First Embodiment

As described above, by using the power supply module according to the first embodiment, the ripple noise can be typically reduced. In particular, when the insulating resin member 108 is provided as shown in FIG. 3, the ripple noise is more likely to increase, but even in this case, the ripple noise can be sufficiently reduced.

Since a method in PTL 1 is a method of mechanically variably adjusting positions of electrodes, it is difficult to apply the method when the positions of the electrodes are fixed by the insulating resin member 108. However, the method according to the first embodiment can be applied regardless of the presence or absence of the insulating resin member 108. In particular, when the insulating resin member 108 is present, the stray capacitance can be adjusted taking into consideration an influence of the insulating resin member 108. Further, as compared with the case of using the mechanical variable adjustment method as in PTL 1, it is possible to increase an adjustment resolution at a lower cost regardless of the presence or absence of the insulating resin member 108 by using the method according to the first embodiment.

Second Embodiment

<<Configuration of Power Supply Module>>

Figure 4:
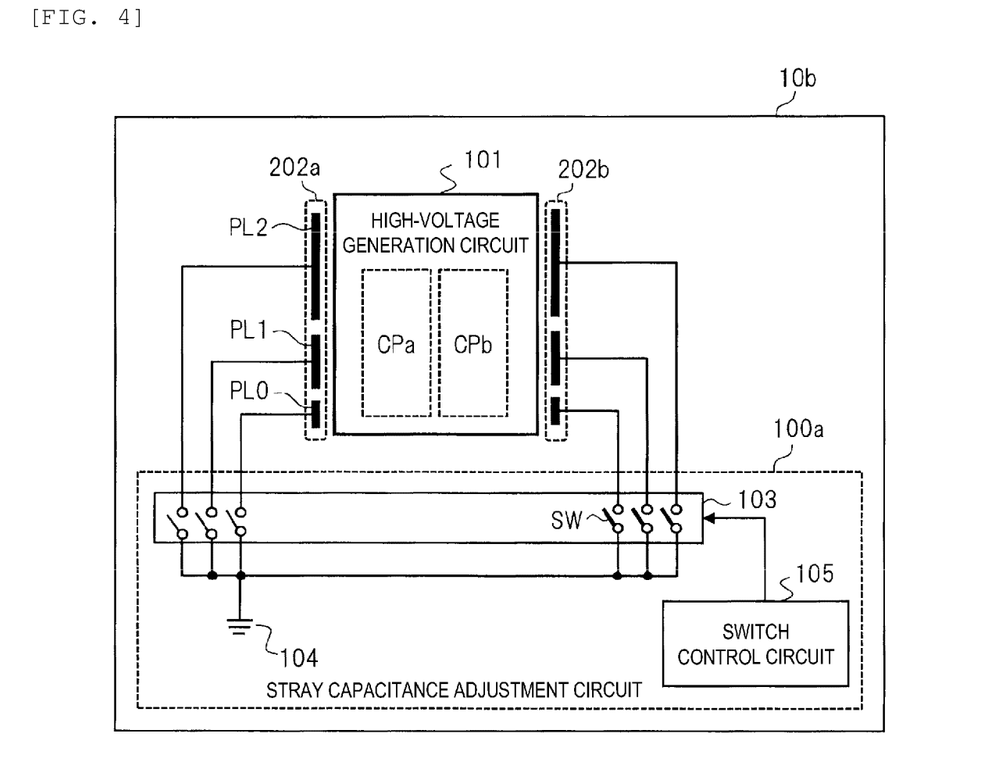
FIG. 4 is a schematic diagram showing a configuration example of a power supply module according to a second embodiment of the invention.

FIG. 4 is a schematic diagram showing a configuration example of a power supply module according to a second embodiment of the invention. A power supply module 10b shown in FIG. 4 is different from the configuration example in FIG. 1 in a configuration of a left electrode (a first electrode) 202a and a right electrode (a second electrode) 202b. Each of the left electrode 202a and the right electrode 202b is configured with a plurality of split electrodes PL0, PL1, and PL2. Further, at least a part (in this example, all) of the plurality of split electrodes PL0, PL1, and PL2 differ in size (area) from each other.

In the example of FIG. 4, the sizes of the split electrodes PLn (n=0, 1, 2) differ in units of $2^n$ times. As a specific example, the sizes of the split electrodes PL0, PL1, and PL2 are 10 $mm^2$, 20 $mm^2$, and 40 $mm^2$, respectively. Thus, it is possible to obtain the same resolution while reducing the number of the split electrodes and the number of the switches SW by using the split electrodes having different sizes, for example, as compared with the case of using the split electrodes having the same size.

An effect of reducing the number of split electrodes (number of switches) is particularly improved in a case where the sizes of the split electrodes are determined in units of $2^n$ times. For example, when three split electrodes PL0, PL1, and PL2 are used, adjustment at 8 ($=2^3$) grades (in units of 10 mm$^2$ in a range of 0 mm$^2$ to 70 mm$^2$) can be performed. In this way, when a size of an electrode connected to the reference power supply voltage 104 is variably adjusted, ideally, the capacitance values of the stray capacitances are also adjusted in proportion to the size of the electrode.

Figure 5:
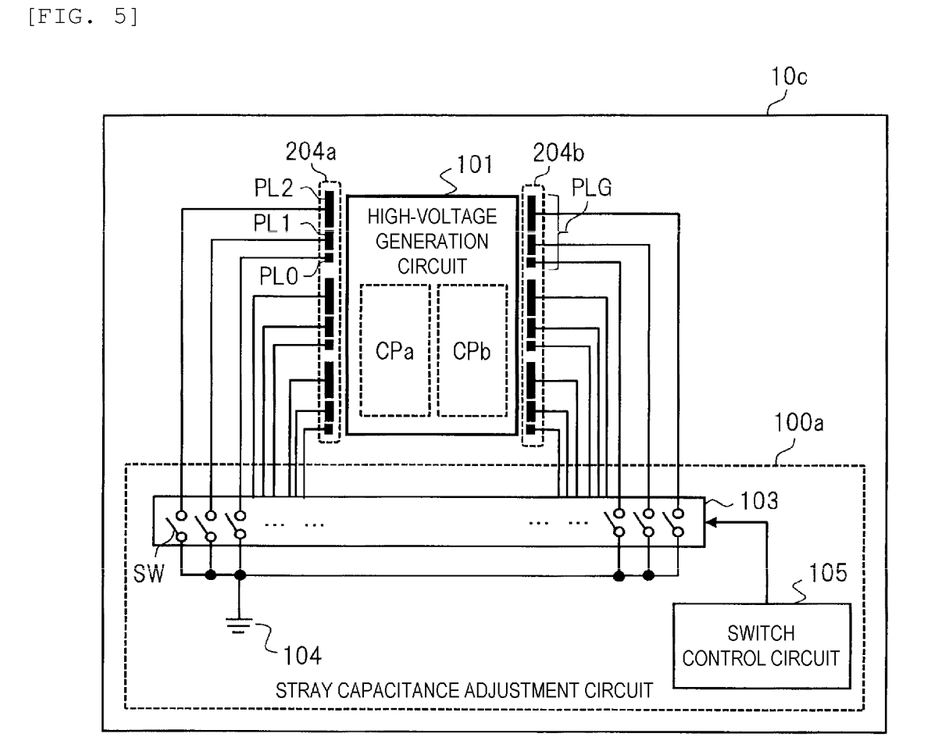
FIG. 5 is a schematic diagram showing a configuration example of a power supply module according a modification of FIG. 4.

FIG. 5 is a schematic diagram showing a configuration example of a power supply module according to a modification of FIG. 4. A power supply module 10c shown in FIG. 5 is different from the configuration example in FIG. 4 in a configuration of a left electrode (a first electrode) 204a and a right electrode (a second electrode) 204b. Each of the left electrode 204a and the right electrode 204b includes a plurality of electrode groups PLG. Further, similar to the case in FIG. 4, a plurality of split electrodes PL0, PL1, and PL2 in each of the plurality of electrode groups PLG differ in size from one another in units of $2^n$ times.

Here, for example, in the configuration example of FIG. 4 described above, when the size of the left electrode 202a is adjusted at 8 grades with the same step width, ideally, the capacitance values of the stray capacitances are also adjusted at 8 grades with the same step width. However, in detail, the step widths of the capacitance values of the stray capacitances are not always the same. This is because the capacitance values of the stray capacitances depend on relative positional relationships between the split electrodes and each component in the high-voltage generation circuit 101. Accordingly, for example, when the step widths of the capacitance values of the stray capacitances are significantly different, it may be difficult to set the capacitance values of the stray capacitances to a target value.

Therefore, in FIG. 5, the plurality of electrode groups PLG are provided, and are dispersedly provided at different positions, respectively. Accordingly, even if there is position dependence of the split electrodes, it is easy to set the capacitance values of the stray capacitances to the target value. That is, by selecting one or more from the plurality of electrode groups PLG and selecting one or more of the split electrodes PL0, PL1, and PL2 from the selected electrode group PLG, a capacitance value close to the target value can be easily obtained by a combination thereof.

Main Effects of Second Embodiment

As described above, in addition to the various effects described in the first embodiment, further, the number of required split electrodes and the number of required switches SW can be reduced by using the power supply module according to the second embodiment. As a result, cost reduction and the like of the power supply module can be achieved.

Third Embodiment

<<Configuration of Power Supply Module>>

Figure 6:
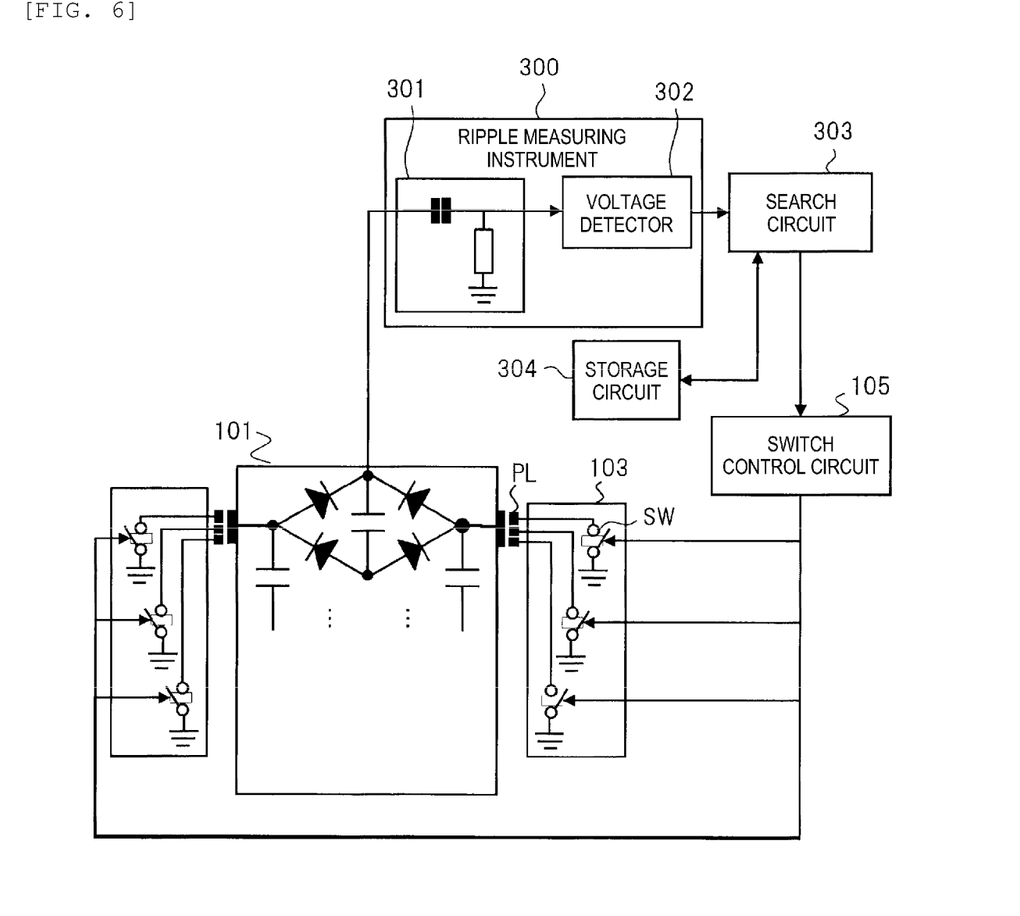
FIG. 6 is a schematic diagram showing a configuration example of a power supply module according to a third embodiment of the invention.

FIG. 6 is a schematic diagram showing a configuration example of a power supply module according to a third embodiment of the invention. The power supply module shown in FIG. 6 includes, for example, a ripple measuring instrument 300, a search circuit 303, and a storage circuit 304, in addition to the high-voltage generation circuit 101, the split electrodes PL, the switch group 103, and the switch control circuit 105 as shown in FIG. 1.

The ripple measuring instrument 300 includes a high-pass filter 301 and a voltage detector 302, and measures a ripple amplitude in an output voltage of the high-voltage generation circuit 101. At this time, the high-pass filter 301 extracts ripple noise from the output voltage of the high-voltage generation circuit 101, and the voltage detector 302 detects a voltage amplitude of the ripple noise.

The search circuit 303 changes on and off states of the plurality of switches SW in the switch group 103 via the switch control circuit 105, and searches for an on and off state with which the ripple amplitude measured by the ripple measuring instrument 300 is minimized. Further, the search circuit 303 stores the on and off state obtained as a search result in the storage circuit 304. The switch control circuit 105 controls the switch group 103 based on the on and off state stored in the storage circuit 304 in a subsequent normal operation.

The voltage detector 302, the search circuit 303, and the storage circuit 304 can be implemented in various implementations, for example, a typical form using a single or a plurality of dedicated integrated circuits (IC), and a typical form using a microcomputer. For example, when a microcomputer is used, the voltage detector 302 is implemented with an analog-digital converter or the like, and the search circuit 303 is implemented by program processing or the like using a central processing unit (CPU). Such a microcomputer may be mounted on the same wiring circuit board as the high-voltage generation circuit 101. When the dedicated IC is used, for example, the search circuit 303 is implemented with a digital circuit or the like.

<<Details of Search Circuit>>

Figure 7:
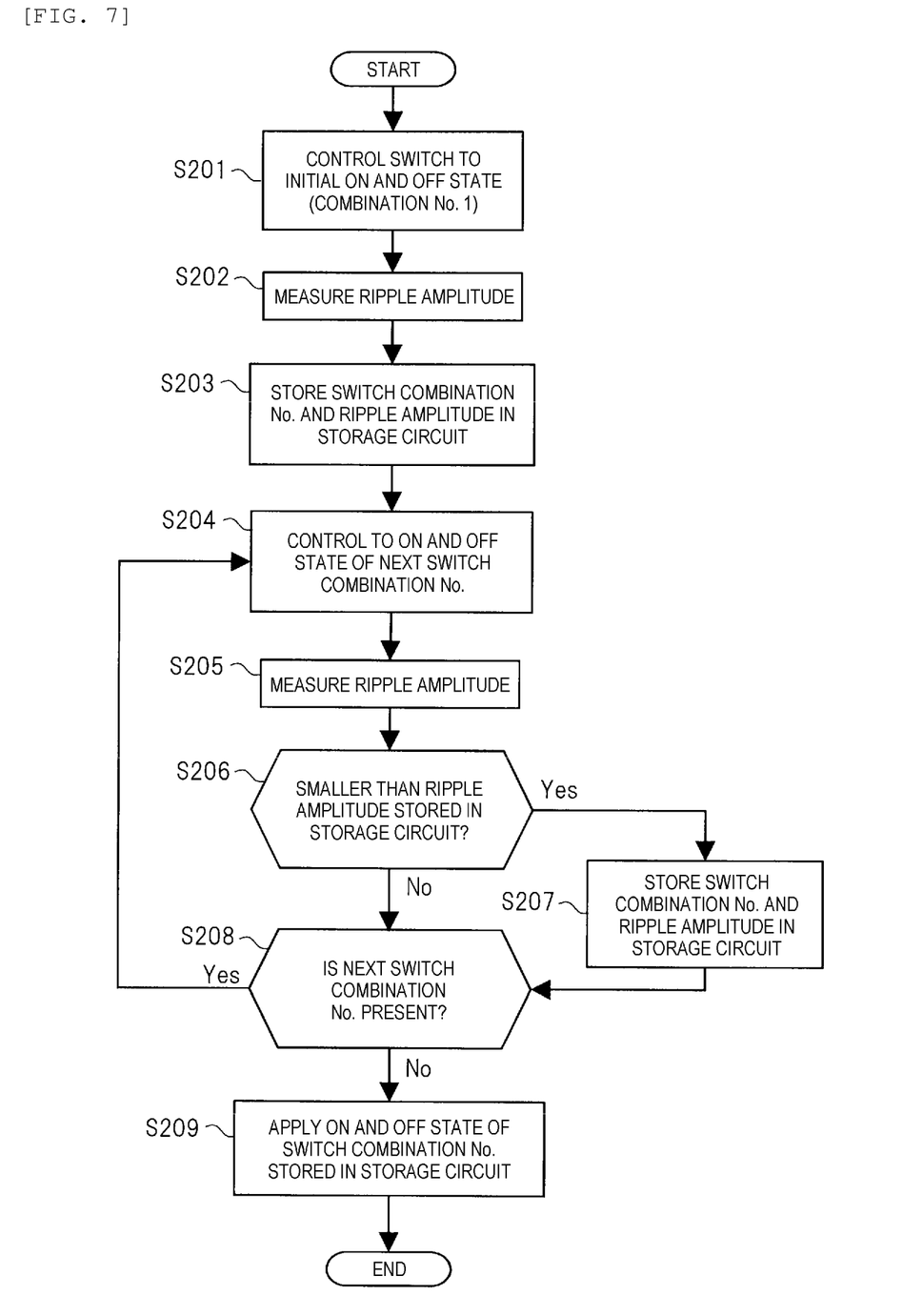
FIG. 7 is a flowchart showing an example of processing content of a search circuit in FIG. 6.
Figure 8:
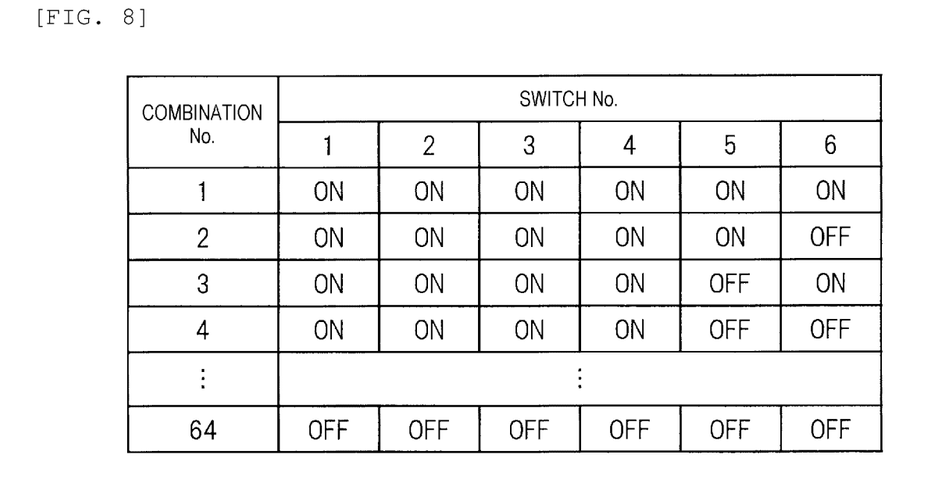
FIG. 8 is a table showing an example of a combination of on and off states of switches in the power supply module of FIG. 6.

FIG. 7 is a flowchart showing an example of processing content of the search circuit in FIG. 6. FIG. 8 is a table showing an example of a combination of on and off states of switches in the power supply module of FIG. 6. In FIG. 8, here, it is assumed that each of a left electrode and a right electrode includes three split electrodes PL. In this case, switch Nos., which are unique numbers, are assigned to six switches SW corresponding to a total of six split electrodes PL, respectively. With the six switches SW, there are 64 combinations in the on and off state, and a combination No. is assigned to each of these 64 combinations. A combination table as shown in FIG. 8 is stored in the storage circuit 304 in advance, for example.

A flow in FIG. 7 is appropriately executed at a predetermined timing. Examples include a case where the flow is executed at a system initialization stage after power is turned on, a case where the flow is executed according to a request of a user such as during system maintenance, or a case where the flow is executed only once after assembling the power supply module.

In step S201 of FIG. 7, the search circuit 303 acquires an on and off state corresponding to a combination No. 1 from the storage circuit 304, and sets the on and off state in the switch group 103 via the switch control circuit 105. In step S202, the search circuit 303 measures a ripple amplitude of the high-voltage generation circuit 101 by using the ripple measuring instrument 300. In step S203, the search circuit 303 stores a correspondence relation between a current combination No. and the measured value of the ripple amplitude in the storage circuit 304.

Thereafter, in step S204, the search circuit 303 acquires an on and off state corresponding to a next combination No. from the storage circuit 304, and sets the on and off state in the switch group 103 via the switch control circuit 105. In step S205, the search circuit 303 measures the ripple amplitude of the high-voltage generation circuit 101 by using the ripple measuring instrument 300.

Subsequently, in step S206, the search circuit 303 determines whether a current measured value of the ripple amplitude obtained in step S205 is smaller than an old measured value of the ripple amplitude stored in the storage circuit 304. When the current measured value is smaller than the old measured value in step S206 (at the time of "Yes"), the search circuit 303 stores a correspondence relation between the current combination No. and the current measured value of the ripple amplitude in the storage circuit 304 in a form of overwriting the existing correspondence relation in step S207.

On the other hand, when the current measured value is equal to or greater than the old measured value in step S206 (at the time of "No"), the search circuit 303 determines whether a next combination No. is present in the storage circuit 304 in step S208. When the next combination No. is present in step S208 (at the time of "Yes"), the search circuit 303 returns to step S204, and repeats the processing of steps S204 to S207 until no next combination No. is present.

On the other hand, when no next combination No. is present in step S208 (at the time of "No"), the search circuit 303 ends a search operation. As a result, the storage circuit 304 stores, as the search result, only the combination No. (that is, the on and off state of each switch SW) that minimizes the ripple amplitude. In step S209, when performing a normal operation thereafter, the search circuit 303 instructs the switch control circuit 105 of the on and off state corresponding to the search result (combination No.) in the storage circuit 304. In response to this, the switch control circuit 105 controls the switch group 103.

Although a method of searching exhaustively for a combination of switches SW that minimize the ripple amplitude is used here, the combination may be searched by an iterative method such as a dichotomy method. Although an application example to the configuration example in FIG. 1 is shown here, it is needless to say that the application example can be similarly applied to the configuration example in FIG. 4 or FIG. 5.

Main Effects of Third Embodiment

As described above, in addition to the various effects described in the first embodiment and the second embodiment, further, the stray capacitance can be automatically adjusted to minimize the ripple amplitude by using the power supply module according to the third embodiment. For example, the adjustment of the stray capacitance may be required to be performed only once after assembling of the power supply module. In such a case, for example, the ripple measuring instrument 300 and the search circuit 303 in FIG. 6 may be mounted on an external test device or the like.

A capacitance value of the stray capacitance may change accompanying, for example, change with time of the insulating resin member 108 in FIG. 3. In this case, it is desirable that the ripple measuring instrument 300 and the search circuit 303 be mounted as a part of the power supply module in order to easily readjust the stray capacitance in an actual use stage. At this time, it is desirable that an enable signal or the like can be issued from an outside to the search circuit 303.

Fourth Embodiment

<<Configuration of Power Supply Module>>

Figure 9:
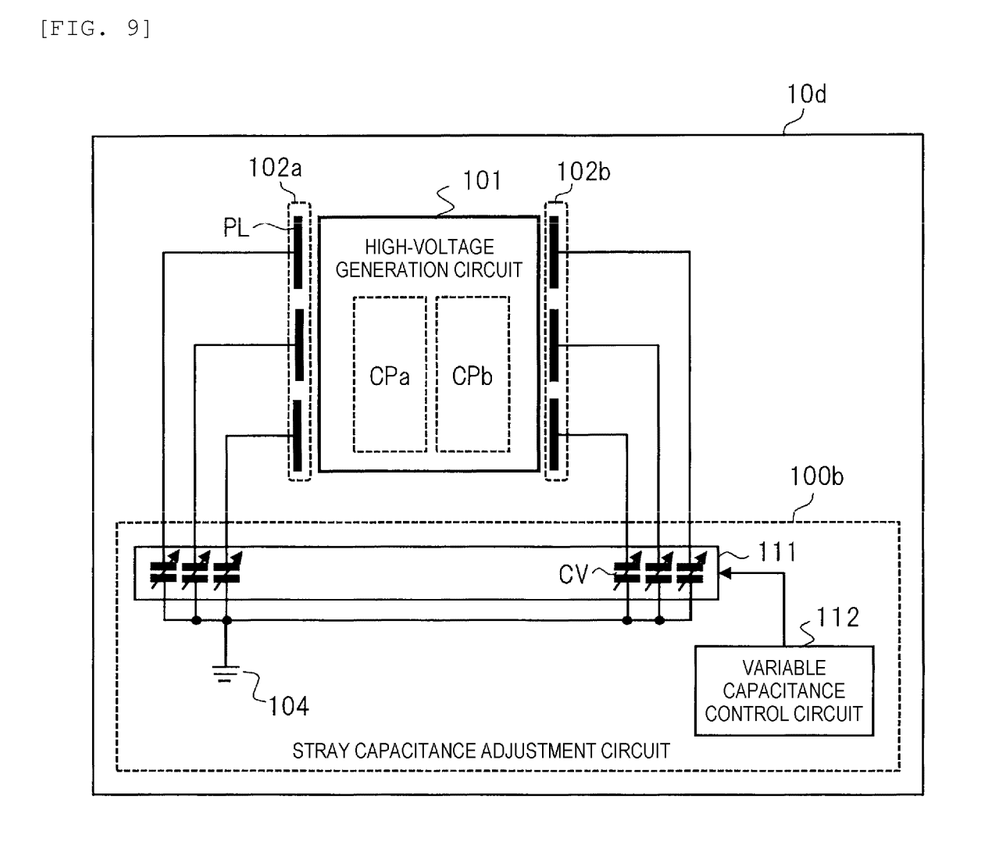
FIG. 9 is a schematic diagram showing a configuration example of a power supply module according to a fourth embodiment of the invention.

FIG. 9 is a schematic diagram showing a configuration example of a power supply module according to a fourth embodiment of the invention. A power supply module 10d shown in FIG. 9 is different from the configuration example in FIG. 1 in a configuration of a stray capacitance adjustment circuit 100b. The stray capacitance adjustment circuit 100b in FIG. 9 includes a variable capacitance group 111 including a plurality of variable capacitance elements CV, and a variable capacitance control circuit 112. The plurality of variable capacitance elements CV are connected between a plurality of split electrodes PL in the left electrode 102a and the right electrode 102b and the reference power supply voltage 104, respectively. The variable capacitance control circuit 112 controls a capacitance value of each of the plurality of variable capacitance elements CV.

With such a configuration, the stray capacitance adjustment circuit 100b electrically controls an electrical connection characteristic between the left electrode 102a and the reference power supply voltage 104 and an electrical connection characteristic between the right electrode 102b and the reference power supply voltage 104. Thus, the stray capacitance adjustment circuit 100b adjusts capacitance values of stray capacitances of the booster circuits CPa and CPb of the two systems as in the case of FIG. 1.

Each of the left electrode 102a and the right electrode 102b is configured with a plurality of split electrodes PL here, and may be configured with, for example, a single split electrode PL. Even in this case, the capacitance values of the stray capacitances can be adjusted by controlling a capacitance value of a variable capacitance element CV connected to the single split electrode PL.

Main Effects of Fourth Embodiment

As described above, by using the power supply module according to the fourth embodiment, the same effects as those of the first embodiment can be obtained.

Fifth Embodiment

<<Configuration of Charged Particle Beam Device>>

Figure 10:
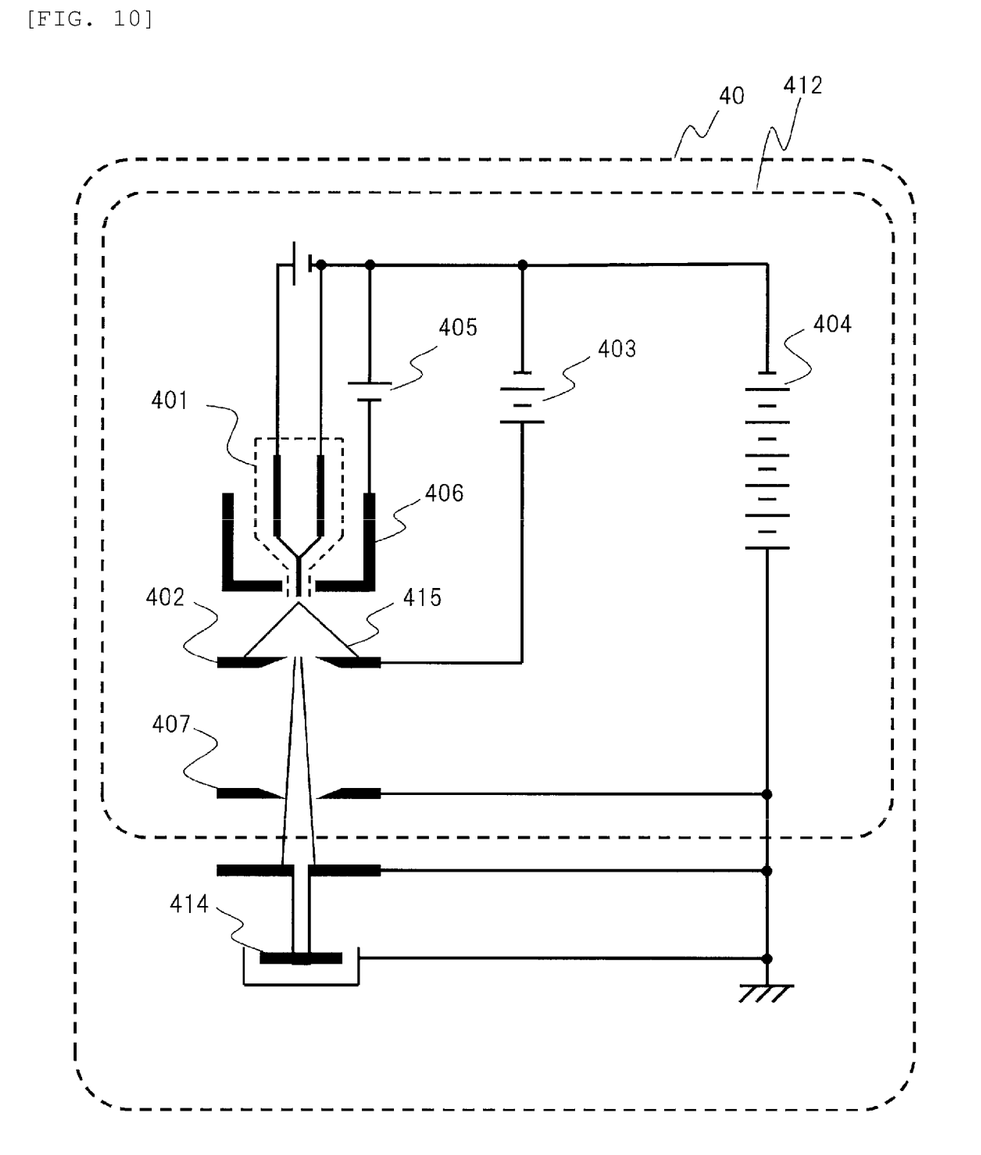
FIG. 10 is a schematic diagram showing a configuration example of a charged particle beam device according to a fifth embodiment of the invention.

FIG. 10 is a schematic diagram showing a configuration example of a charged particle beam device according to a fifth embodiment of the invention. A charged particle beam device 40 shown in FIG. 10 includes an electron gun 412 that controls emission, acceleration and the like of an electron beam 415, which is one of charged particle beams, and irradiates a target (sample) 414 or the like, which is an object to be measured, with the electron beam 415 from the electron gun 412. The electron gun 412 includes an electron source 401, an extraction electrode 402, an extraction electrode power supply 403, an acceleration power supply 404, a suppressor electrode power supply 405, a suppressor electrode 406, and an acceleration electrode 407.

The electron source 401 emits electrons. The extraction electrode power supply 403 generates a voltage to be applied to the extraction electrode 402 (for example, a voltage positive with respect to an electron source voltage) and applies the voltage to the extraction electrode 402. In response to this, the extraction electrode 402 draws the electrons from the electron source 401 toward a target. The acceleration power supply 404 generates a voltage for accelerating the electrons extracted by the extraction electrode 402 and applies the voltage to the acceleration electrode 407. In response to this, the acceleration electrode 407 attracts and accelerates the electrons extracted by the extraction electrode 402. The suppressor electrode 406 prevents thermions from entering the electron beam 415. The suppressor electrode power supply 405 generates a voltage to be applied to the suppressor electrode 406.

In such a configuration, the power supply module according to any one of the first embodiment to the fourth embodiment is applied to at least one (preferably both) of the extraction electrode power supply 403 and the acceleration power supply 404. Further, the power supply module according to any one of the first embodiment to the fourth embodiment may be applied to the suppressor electrode power supply 405. For example, if ripple noise is generated in an output voltage from each of these power supplies, fluctuation may occur in the electron beam 415, and performance of the charged particle beam device (for example, accuracy of an irradiation position of the electron beam 415, and accuracy of variation in irradiation energy) may deteriorate. Therefore, it is useful to apply the power supply module according to any one of the first embodiment to the fourth embodiment.

Main Effects of Fifth Embodiment

As described above, in addition to the various effects described in the first embodiment to the fourth embodiment, fluctuation of the charged particle beam can be prevented and performance of the charged particle beam device can be improved by using the charged particle beam device according to the fifth embodiment.

Although the invention made by the present inventors is specifically described based on the embodiments as described above, the invention is not limited to the embodiments described above, and various modifications can be made without departing from the gist of the invention. For example, the embodiments described above are described in detail for easy understanding of the invention, and the invention is not necessarily limited to those including all the configurations described above. A part of the configuration of one embodiment can be replaced with the configuration of another embodiment, and the configuration of another embodiment can be added to the configuration of one embodiment. In addition, a part of the configuration of each embodiment may be added, deleted, or replaced with another configuration.

REFERENCE SIGN LIST 10a to 10d power supply module
40 charged particle beam device
100a, 100b stray capacitance adjustment circuit
101 high-voltage generation circuit
102a left electrode
102b right electrode
104 reference power supply voltage
105 switch control circuit
106 housing
107 reference power supply voltage
108 insulating resin member
300 ripple measuring instrument
303 search circuit
401 electron source
402 extraction electrode
403 extraction electrode power supply
404 acceleration power supply
1001 capacitive element
1002 diode
CPa, CPb booster circuit
PL split electrode
PLG electrode group
SW switch

The invention claimed is:

1. A power supply module comprising:
a symmetric high-voltage generation circuit that includes booster circuits of two systems that are configured to be symmetrical to each other, and that performs a boosting operation by using a capacitive element and a diode in the booster circuits of the two systems;
a housing that houses the high-voltage generation circuit and to which a reference power supply voltage is to be applied;
a first electrode that is fixedly provided in a vicinity of one of the booster circuits of the two systems in the housing;
a second electrode that is fixedly provided in a vicinity of the other of the booster circuits of the two systems in the housing; and
a stray capacitance adjustment circuit that adjusts a capacitance value of a stray capacitance of the booster circuits of the two systems by electrically controlling an electrical connection characteristic between the first electrode and the reference power supply voltage, and an electrical connection characteristic between the second electrode and the reference power supply voltage.

2. The power supply module according to claim 1, further comprising:
an insulating resin member that covers the high-voltage generation circuit, the first electrode, and the second electrode in the housing.

3. The power supply module according to claim 2, wherein
each of the first electrode and the second electrode is configured with a plurality of split electrodes, and
the stray capacitance adjustment circuit includes
a plurality of switches that are connected between the plurality of split electrodes and the reference power supply voltage, respectively, and
a switch control circuit that controls on and off of each of the plurality of switches.

4. The power supply module according to claim 3, wherein
at least a part of the plurality of split electrodes differ in size from each other.

5. The power supply module according to claim 4, wherein
each of the first electrode and the second electrode includes a plurality of electrode groups, and
the plurality of split electrodes in each of the plurality of electrode groups differ in size from each other in units of $2^n$ (n=0, 1, 2, . . . ) times.

6. The power supply module according to claim 3, further comprising:
a ripple measuring instrument that measures a ripple amplitude in an output voltage of the high-voltage generation circuit; and
a search circuit that changes an on and off state of the plurality of switches via the switch control circuit and searches for the on and off state with which the ripple amplitude is minimized.

7. A charged particle beam device comprising:
an electron source;
an extraction electrode that extracts electrons from the electron source;
an extraction electrode power supply that generates a voltage to be applied to the extraction electrode; and an acceleration power supply that accelerates the electrons, wherein at least one of the extraction electrode power supply and the acceleration power supply includes a symmetric high-voltage generation circuit that includes booster circuits of two systems that are configured to be symmetrical to each other, and that performs a boosting operation by using a capacitive element and a diode in the booster circuits of the two systems, a housing that houses the high-voltage generation circuit and to which a reference power supply voltage is to be applied, a first electrode that is fixedly provided in a vicinity of one of the booster circuits of the two systems in the housing, a second electrode that is fixedly provided in a vicinity of the other of the booster circuits of the two systems in the housing, and a stray capacitance adjustment circuit that adjusts a capacitance value of a stray capacitance of the booster circuits of the two systems by electrically controlling an electrical connection characteristic between the first electrode and the reference power supply voltage, and an electrical connection characteristic between the second electrode and the reference power supply voltage.

8. The charged particle beam device according to claim 7, further comprising:

an insulating resin member that covers the high-voltage generation circuit, the first electrode, and the second electrode in the housing.

9. The charged particle beam device according to claim 8, wherein each of the first electrode and the second electrode includes a plurality of split electrodes, and the stray capacitance adjustment circuit includes a plurality of switches that are connected between the plurality of split electrodes and the reference power supply voltage, respectively, and a switch control circuit that controls on and off of each of the plurality of switches.

10. The charged particle beam device according to claim 9, further comprising:

a ripple measuring instrument that measures a ripple amplitude in an output voltage of the high-voltage generation circuit; and a search circuit that changes an on and off state of the plurality of switches via the switch control circuit and searches for the on and off state with which the ripple amplitude is minimized.

* * * * *